United States Patent [19]

Okrzesik et al.

[11] Patent Number: 4,706,044
[45] Date of Patent: Nov. 10, 1987

[54] ASTABLE MULTIVIBRATOR WITH DUTY CYCLE COMPENSATION

[75] Inventors: Thaddeus P. Okrzesik, Chicago; Robert J. Alvord, Elmwood Park, both of Ill.

[73] Assignee: Zenith Electronics Corporation, Glenview, Ill.

[21] Appl. No.: 919,157

[22] Filed: Oct. 15, 1986

[51] Int. Cl.$^4$ ............................................. H03K 3/281
[52] U.S. Cl. .................................. 331/113 R; 331/145
[58] Field of Search .................. 331/113 R, 144, 145; 358/148, 158

[56] References Cited

U.S. PATENT DOCUMENTS 4,621,240 11/1986 Alvord et al. ................. 331/113 R Primary Examiner—Eugene R. LaRoche
Assistant Examiner—Robert J. Pascal

[57] ABSTRACT

An astable multivibrator that has an integrating network coupled from the output of one of the transistors for developing an operating potential. The operating potential is coupled to the RC timing networks that interconnect the two transistors such that when the transistors are switched by a horizontal sync pulse, the duty cycle is compensated.

3 Claims, 2 Drawing Figures

ASTABLE MULTIVIBRATOR WITH DUTY CYCLE COMPENSATION

BACKGROUND OF THE INVENTION AND PRIOR ART

This invention relates generally to astable multivibrators and particularly to astable multivibrators that are utilized in applications involving operation at two displaced frequencies.

The invention is specifically adapted for use in connection with deflection circuits for video monitors having the capability of operating at two deflection frequencies, depending upon the degree of resolution desired in the display. Video monitors incorporate a cathode ray tube (CRT) that has a deflection yoke that is supplied with deflection voltages developed by a horizontal output transistor and a deflection transformer. The horizontal output transistor is driven from an oscillator source that is synchronized or keyed to incoming video information by an appropriate synchronizing signal, generally referred to as horizontal sync pulses. In many monitors, a display of higher resolution is made available. Conventional monitor deflection frequencies are similar to those used in the display of television signals, namely, about 15.7 KHz. Higher frequency monitor displays may be on the order of 18 KHz. Still other monitors utilize display frequencies of about 22 KHz.

A video display monitor designated ZMM1470G, manufactured by ZENITH DATA SYSTEMS, a subsidiary of ZENITH ELECTRONICS CORPORATION, the assignee of the present application, incorporates an astable multivibrator circuit. The monitor has two display frequencies, one approximating 16 KHz and the other approximating 22 KHz, which are selectable by operation of a suitable switch.

As is well known, astable multivibrators generally perform best when the transistor that supplies the base drive to the horizontal output transistor is conducting about 60% of the time, that is, has a 60% duty cycle. Difficulty may be experienced when switching between two widely displaced deflection frequencies in a monitor having an astable multivibrator. Often the system cannot react quickly enough to enable the astable multivibrator to attain proper sync. Indeed, under certain conditions, the circuit can actually fail to achieve synchronization and go into a lock-up mode.

To achieve the desired duty cycle for the horizontal output transistor in a prior art monitor, a duty cycle compensating circuit was used which, in response to a voltage change in the high voltage regulator, changed the resistance in the RC network supplying one of the transistors in the astable multivibrator. The regulator sensed a voltage change when switching between the deflection frequencies and reacted to maintain an essentially constant high voltage. The sensed change was used to operate a transistor switch circuit for changing the resistance in the RC time constant circuit and alter the duty cycle of the astable multivibrator to maintain the desired duty cycle of the horizontal output transistor more closely. That circuit worked well for deflection frequency changes between 15 and 18 KHz. That circuit, however, would not correct for the problem encountered when switching between deflection frequencies of 15 KHz and 22 KHz. In those instances, the astable multivibrator would often experience a condition where it did not lock in sync, since the sync signals did not occur during the "on" time of the proper one of its transistors.

OBJECTS OF THE INVENTION

A principal object of the invention is to provide a novel duty cycle compensation circuit for an astable multivibrator.

Another object of the invention is to provide an improved astable multivibrator circuit for use in a dual frequency video monitor.

BRIEF DESCRIPTION OF THE DRAWING

These and other objects of the invention will be apparent from a reading of the following description in conjunction with the drawing in which.

DESCRIPTION OF THE PREFERRED EMBODIMENT

Figure 1:
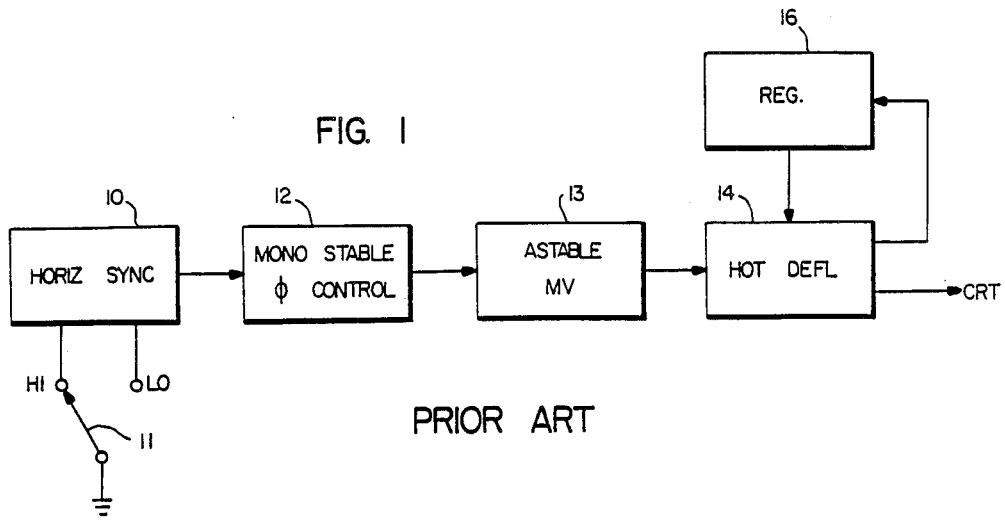
FIG. 1 represents a simplified block diagram of a portion of a prior art monitor utilizing an astable multivibrator.

The invention comprises a duty cycle compensating circuit for an astable multivibrator that uses the collector output voltage of one of the transistors as a duty cycle reference. A change in the output voltage is translated into a change in the operating potentials for the astable multivibrator and tends to keep the duty cycle of the transistors relatively constant. Referring to FIG. 1, a partial block diagram of a prior art dual frequency video monitor is shown having a horizontal sync circuit 10 which has a high and low frequency output that is controlled by a switch 11. The horizontal sync circuit supplies a monostable phase control circuit 12 which in turn supplies sync pulses to an astable multivibrator 13 that has an output supplying a horizontal output transistor and deflection circuit 14. The output of circuit 14 is supplied to a regulator 16 for helping to maintain the potential of circuit 14 constant and to a CRT (not shown).

Figure 2:
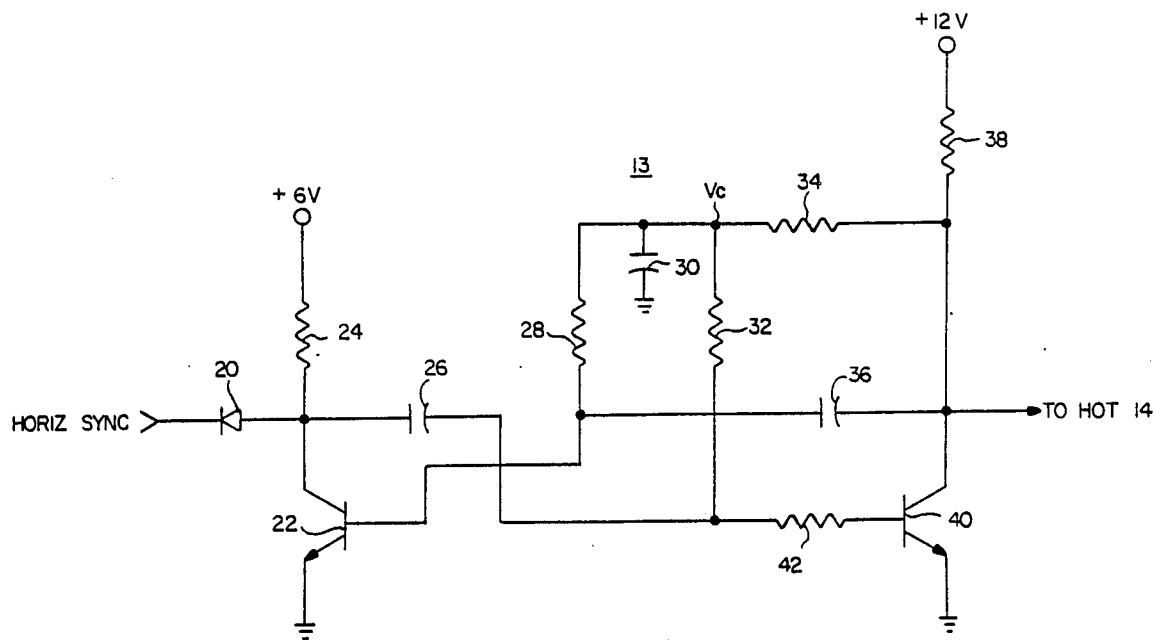
FIG. 2 represents a schematic diagram of an astable multivibrator constructed in accordance with the invention.

In FIG. 2, an astable multivibrator 13, constructed in accordance with the invention, is shown in schematic form. Horizontal sync pulses from monostable phase control circuit 12 are supplied to the cathode of a diode 20. The anode of diode 20 is connected to the junction of the collector of a transistor 22 and its load resistor 24, which is returned to a source of DC voltage, indicated as +6V. The emitter of transistor 22 is connected to ground and its collector is connected through a capacitor 26, to a resistor 42 that is connected to the base electrode of a transistor 40. The collector of transistor 40 is connected to a source of DC voltage, illustrated as +12V, through a resistor 38 and also through a coupling capacitor 36 back to the base of transistor 22. The bases of both transistors 22 and 40 are supplied through resistors 28 and 32, respectively, from a voltage junction Vc that is coupled to a capacitor 30, the other electrode of which is connected to ground. Junction Vc is connected to +12V through series connected resistors 34 and 38. The collector output of transistor 40 is supplied to horizontal output and deflection circuit 14.

Resistor 28 and capacitor 36 form a charging network for the drive of transistor 22. More specifically, the base voltage of transistor 22 is limited by its base emitter junction to about 0.7 volts. When transistor 22 is cut off, its collector is at +6 volts and when it is turned on, its collector is at saturation voltage. Turning on of transistor 22 results in a negative-going pulse which is coupled to capacitor 26 and resistor 42 to the base of transistor 40 which shuts transistor 40 off and its collector goes high. Capacitor 26 charges through resistor 32 to turn on transistor 40. Thus, the astable multivibrator oscillates at a fixed free-running frequency with transistors 22 and 40 alternately turning on and off.

Under normal operation, a negative-going horizontal sync pulse is applied to the collector of transistor 22 while transistor 22 is off. This pulse is coupled through capacitor 26 and acts to prematurely shut off transistor 40. The positive-going collector voltage of transistor 40 is coupled through capacitor 36 to prematurely turn on transistor 22 and holds its collector low until capacitor 26 charges sufficiently to again turn on Q 40 and switch states. The RC time constant established by resistor 28 and capacitor 36 is shortened by the horizontal sync pulse but when the horizontal sync pulse occurs, transistor 22 remains on and transistor 40 remains off for the full time defined by the RC time constant established by resistor 32 and capacitor 26, independently of horizontal sync pulses. In a prior art astable multivibrator, the off time of transistor 22 (the on time of transistor 40) changes with frequency while the on time of transistor 22 (the off time of transistor 40) remains constant. This results in a change in the duty cycle of the resulting output signal.

Thus, with the prior art astable multivibrator, during sync operation, one state of the output square wave is variable with frequency while the other state is constant and independent of frequency. Assuming that the free-run frequency remains below the sync frequency, changing the time constant on the frequency dependent state side of the multivibrator will have no effect on its output waveform since this RC charging waveform is shortened by the sync pulse before it reaches the free-run triggering voltage of its transistor. However, changing the time constant on the frequency independent side of the waveform will change the waveform of the output.

It will be appreciated by those skilled in the art that the astable multivibrator circuit illustrated in FIG. 2 differs from prior art astable multivibrator circuits in the connection of the collectors of the two transistors to different sources of DC operating potential and the inclusion of the voltage supply for junction Vc in an integrating circuit. The integrating circuit involved consists of resistor 38, resistor 34 and capacitor 30. It will be further appreciated that the connection of the collector of transistor 40 to the junction of resistors 34 and 38 results in the voltage at junction Vc being dependent upon the conductive state of transistor 40. Under conditions where transistor 40 is conductive for a long period of time, the potential of its collector will be near ground and the voltage at the junction of Vc will be much smaller than for periods when transistor 40 is cut off for a long time. Under conditions where transistor 40 is non-conductive for a significant time, the voltage at the junction of resistors 34 and 38 will be much higher, capacitor 30 will charge for a longer period of time, and junction Vc will attain a higher voltage. This higher voltage is applied to the bases of the transistors 22 and 40 and compensates the respective duty cycles of the transistors to lengthen the duty cycle of transistor 40 when it tends to become too short. Thus with the circuit arrangement, the duty cycle of the astable multivibrator is dependent upon the potential at the collector of transistor 40, and consequently, the duty cycle of the drive signal to horizontal output transistor and deflection circuit 14 tends to be stabilized.

As the on time of transistor 40 decreases, the DC level of the voltage at its collector increases. This voltage, therefore, contains information about the duty cycle of the output waveform. If the output waveform is integrated to obtain the DC level of the collector voltage of transistor 40, this level will increase with operating frequency and if the DC increases, the time constant for the states will decrease. While the frequency independent state of the multivibrator is not affected, the frequency dependent state of the multivibrator is affected. If the DC is raised, the on time of transistor 40 will increase before the next sync pulse occurs and the desired duty cycle compensation effect is obtained. Resistor 34 and capacitor 30 provide this integration of the potential at the collector of transistor 40 and the connection of the charging time constant circuits to this potential DC provides the desired duty cycle compensation.

It will be appreciated that the particular circuit arrangement shown is illustrative only and that numerous modifications and changes in the described embodiment of the invention may be made without departing from its true spirit and scope. The invention is to be limited only as defined in the claims.

What is claimed is:

1. In combination with an astable multivibrator including a first and a second transistor, each having an input and an output;
   a first voltage source coupled to the output of said second transistor;
   a second, higher, voltage source coupled to the output of said first transistor;
   DC voltage means coupled to the input circuits of both said transistors;
   first and second RC timing networks interconnecting the input and output circuits of said transistors for determining the frequency of said multivibrator and the respective duty cycles of said transistors;
   means supplying a sync pulse to the input of said first transistor for controlling its turn on time to alter the frequency of said multivibrator;
   a horizontal output transistor coupled to the output of said first transistor; and
   integrating means coupled to the output of said first transistor and to said DC voltage means for compensating said multivibrator to maintain said duty cycle.

2. The combination of claim 1 wherein said integrating means comprises a resistor and a capacitor connected across the output of said first transistor and forming a junction; and
   wherein the junction of said resistor and said capacitor form said DC voltage means.

3. In combination with an astable multivibrator, including a first and a second transistor, each having an input and an output circuit;
   a first DC voltage source coupled to the output of said second transistor;
   a second higher DC voltage source coupled to the output of said first transistor;
   an integrating network comprising a resistor and a capacitor connected across the output of said first transistor;

first and second RC timing networks interconnecting the input and output circuits of said transistors for determining the frequency of said multivibrator and respective duty cycles of said transistors, said timing networks being connected to said DC voltage; and means supplying a sync pulse to the input of said first transistor for controlling its turn-on time to alter the frequency of said multivibrator, said connection of said integrating means to said timing networks compensating said multivibrator for maintaining said duty cycle.

* * * * *